(12) United States Patent
Park

(10) Patent No.: US 8,891,314 B2
(45) Date of Patent: Nov. 18, 2014

(54) SEMICONDUCTOR MEMORY DEVICE AND OPERATING METHOD THEREOF

(75) Inventor: Kyoung Jin Park, Seoul (KR)

(73) Assignee: SK Hynix Inc., Gyeonggi-do (KR)

( * ) Notice: Subject to any disclaimer, the term of this patent is extended or adjusted under 35 U.S.C. 154(b) by 69 days.

(21) Appl. No.: 13/606,100

(22) Filed: Sep. 7, 2012

(65) Prior Publication Data

US 2013/0250697 A1 Sep. 26, 2013

(30) Foreign Application Priority Data

Mar. 22, 2012 (KR) ........................ 10-2012-0029440

(51) Int. Cl.
*G11C 11/34* (2006.01)

(52) U.S. Cl.
USPC ............ 365/185.25; 365/185.17; 365/185.29; 365/185.19; 438/257

(58) Field of Classification Search
USPC ........................... 365/185.25, 185.18, 185.17
See application file for complete search history.

(56) References Cited

U.S. PATENT DOCUMENTS

| 7,859,902 | B2* | 12/2010 | Maejima | 365/185.11 |
|---|---|---|---|---|
| 2008/0151633 | A1* | 6/2008 | Park et al. | 365/185.19 |
| 2012/0280298 | A1* | 11/2012 | Park et al. | 257/314 |
| 2013/0163337 | A1* | 6/2013 | Li et al. | 365/185.17 |

* cited by examiner

*Primary Examiner* — Hoai V Ho
*Assistant Examiner* — Muhammad Islam
(74) *Attorney, Agent, or Firm* — IP & T Group LLP

(57) ABSTRACT

A semiconductor memory device and the operating method thereof use a low pass voltage to boost a channel of unselected cell strings during a program operation, and boost the channel of the cell string by using the GIDL phenomenon, thereby reducing a disturbance influence on the memory cells connected to the unselected cell strings due to a high pass voltage.

14 Claims, 6 Drawing Sheets

US 8,891,314 B2

SEMICONDUCTOR MEMORY DEVICE AND OPERATING METHOD THEREOF

CROSS-REFERENCE TO RELATED APPLICATION

Priority is claimed to Korean patent application number 10-2012-0029440 filed on Mar. 22, 2012, the entire disclosure of which is incorporated herein by reference in its entirety.

BACKGROUND

Exemplary embodiments relate to a semiconductor memory device and an operating method thereof.

Development of a semiconductor manufacturing technology causes demand for a high density memory. In particular, as the integration degree of a memory device having a two-dimensional (2D) structure including memory cells located in a single layer on a semiconductor substrate has reached the limit, a three-dimensional (3D) structure of non-volatile memory device including memory cells stacked vertically on a silicon substrate has been developed.

However, such a 3D non-volatile memory device involves concerns such as instability and/or a degradation of reliability, or the like. Research to solve or release the concerns is actively ongoing.

BRIEF SUMMARY

Exemplary embodiments relate to a (3D) semiconductor memory device capable of reducing disturbance to an unselected memory cell due to a pass voltage during a program operation, and an operating method thereof.

A semiconductor memory device according to an embodiment of the present invention includes: a memory cell array including cell strings, each including word lines stacked on a substrate and a vertical channel layer formed to penetrate the word lines, wherein two or more cell strings are connected to a single bit line through a selection transistor; a peripheral circuit for programming a selected memory cell; and a control circuit for controlling the peripheral circuit to perform a multi-stepwise boosting operation at channels of unselected cell strings to be not programmed during a program operation. Herein, the multi-stepwise boosting operation includes processes of primarily boosting channels of the unselected cell strings by applying a pass voltage to the word lines when drain selection transistors of the unselected cell strings are turned off, and secondarily boosting the channels of the unselected cell strings by using a gate induced drain leakage (GIDL) phenomenon occurring between the turned-off drain selection transistors and the bit line when a first voltage is applied to the bit line.

A semiconductor memory device according to another embodiment of the present invention includes: a memory cell array including cell strings, each including word lines stacked on a substrate and a vertical channel layer formed to penetrate the word lines, wherein each of the cell strings is connected to a common source line through a source selection transistor, and two or more cell strings is connected to a single bit line through a drain selection transistor; a peripheral circuit for programming a selected memory cell; and a control circuit for controlling the peripheral circuit to perform a multi-stepwise boosting operation at channels of unselected cell strings to be not programmed during a program operation.

An operating method of a semiconductor memory device according to another embodiment of the present invention, includes: precharging channels of cell strings connected to drain selection transistors connected to one bit line, respectively; primarily boosting channels of unselected cell strings by applying a pass voltage to word lines coupled to the cell strings when the drain selection transistors connected to the unselected cell strings are turned off; secondarily boosting the channels of the unselected cell strings by using a gate induced drain leakage (GIDL) phenomenon occurring between the drain selection transistors of the unselected cell strings and the bit line by applying a first voltage to the bit line, when the drain selection transistors connected to the unselected cell strings are turned off; and performing programming by applying a program voltage to word lines selected for programming.

An operating method of a semiconductor memory device according to another embodiment of the present invention, includes: precharging channels of cell strings connected to drain selection transistors connected to one bit line, respectively, by using a voltage inputted through the bit line; primarily boosting channels of unselected cell strings by applying a pass voltage to word lines coupled to the cell strings when source selection transistors connected between the unselected cell strings and a common source line are turned off; secondarily boosting the channels of the unselected cell strings by using a gate induced drain leakage (GIDL) phenomenon occurring between the source selection transistors of the unselected cell strings and the common source line by applying a first voltage to the common source line, when the source selection transistors of the unselected cell strings are turned off; and performing programming by applying a program voltage to word lines selected for programming.

DESCRIPTION OF EMBODIMENTS

Hereinafter, some exemplary embodiments of the present disclosure will be described in detail with reference to the accompanying drawings. The figures are provided to allow those having ordinary skill in the art to understand the scope of the embodiments of the disclosure.

Figure 1:
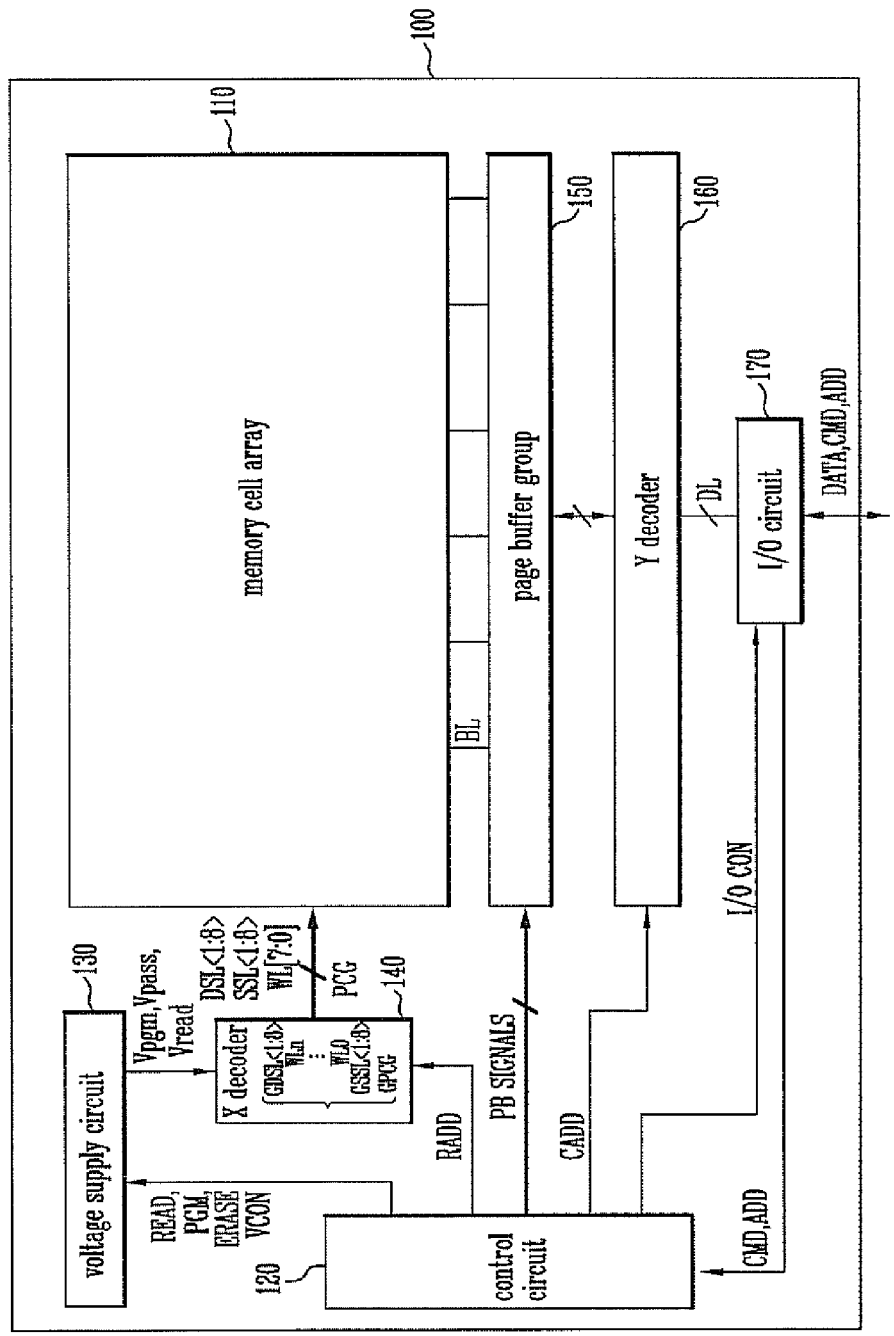
FIG. 1 is a block diagram illustrating a semiconductor memory device in accordance with an embodiment of the present invention.

FIG. 1 is a block diagram illustrating a semiconductor memory device in accordance with an embodiment of the present invention.

Referring to FIG. 1, a semiconductor memory device 100 includes a memory cell array 110 including a plurality of memory cells.

The memory cell array 110 is configured to have a three-dimensional (3D) structure.

The semiconductor memory device 100 includes peripheral circuit groups 130 to 170 for programming memory cells or reading data stored in the memory cells and a control circuit 120 for controlling the peripheral circuit groups 130 to 170.

The peripheral circuit groups include a voltage supply circuit 130, an X decoder 140, a page buffer group 150, a Y decoder 160, and an IO circuit 170.

The voltage supply circuit 130 generates operation voltages, e.g., a program voltage Vpgm, a read voltage Vread, a pass voltage Vpass, an erase voltage Verase, and the like, for program, read, and erase operations, in response to a voltage control signal (VCON), operation mode signals PGM, READ, ERASE, and the like, which are outputted from the control circuit 120.

The X decoder 140 selects one of a plurality of memory blocks BK within the memory cell array 110. The X decoder 140 connects word lines and selection lines of the selected memory block BK and global lines, respectively, to allow an operating voltage to be transferred.

The page buffer group 150 includes page buffers connected to at least one of bit lines, respectively. The page buffers operate during a program, read, or erase operation in response to page buffer control signals PB SIGNALS from the control circuit 120.

The memory cell array 110 having a 3D structure is configured as follows.

Figure 2:
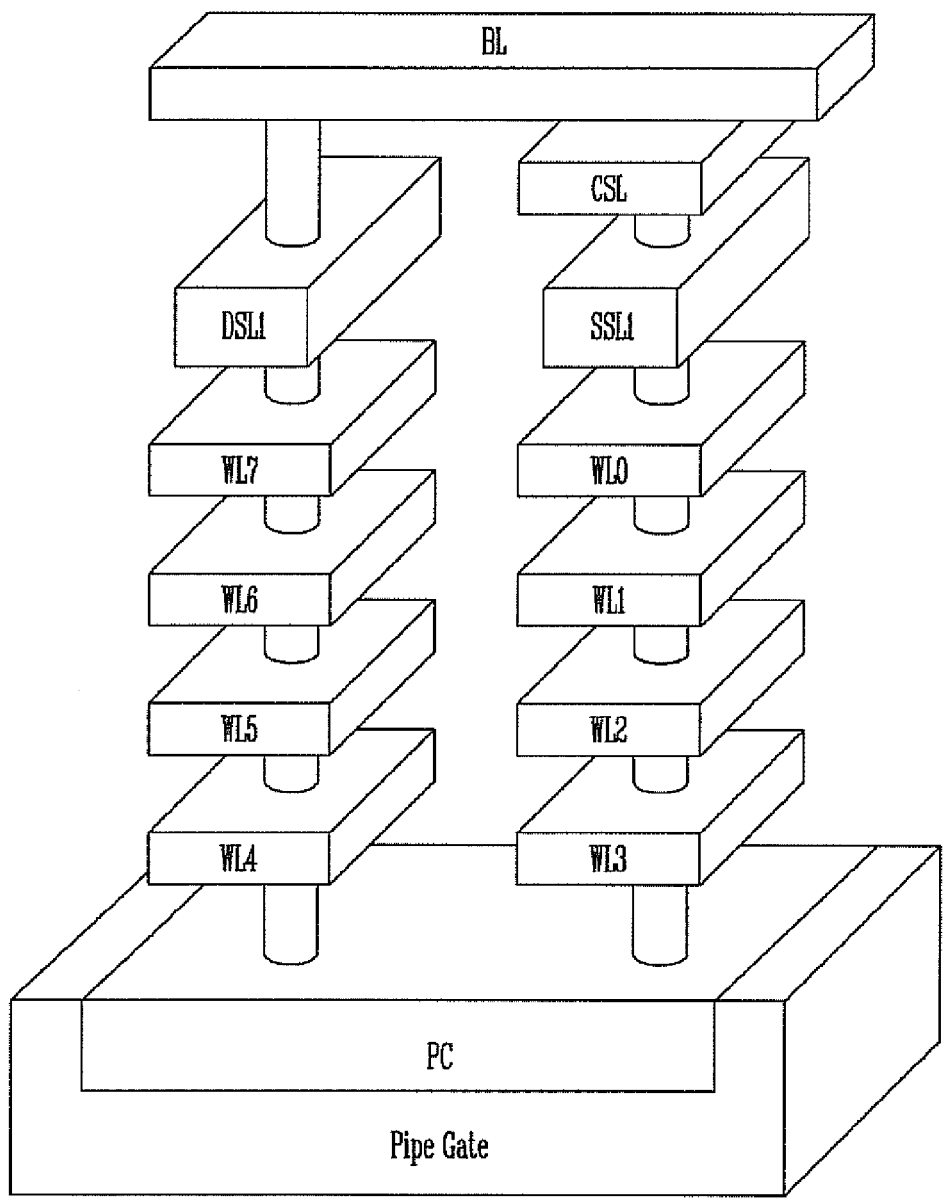
FIG. 2 is a perspective view illustrating a memory cell array.

FIG. 2 is a perspective view illustrating a memory cell array.

FIG. 2 shows only a single cell string among the memory cell array having a 3D structure. Only a conductive part is illustrated and an insulated part is omitted for a convenience of explanation.

Referring to FIG. 2, a PC is configured on a pipe gate. A U-shaped pillar is formed on the PC. $0^{th}$ to third word lines WL0 to WL3 and fourth to seventh word lines WL4 to WL7 are piled in a horizontal direction in the U-shaped pillar.

A drain selection line DSL1 and a source selection line SSL1 are generated in a horizontal direction to encompass the U-shaped pillar.

Contacted areas between the $0^{th}$ to seventh word lines WL0 to WL7 and the pillar make a trap charge-type memory cell. Areas where the drain election line and the source selection line contact with the pillar make a drain selection transistor and a source selection transistor. The U-shaped pillar serves as a channel. A common source line CSL is connected to an end portion of the pillar, i.e., the portion that makes the source selection transistor. The common source line CSL is shared by a plurality of cell strings.

Meanwhile, the PC part is configured in the form of a transistor to connect the U-shaped pillar. When power is input to the pipe gate to connect the U-shaped pillar, the U-shaped pillar may operate as a single cell string.

Also, the memory cell array 110 having a 3D structure is configured in a multi-string structure where two or more cell strings are connected to one bit line.

In an embodiment of the present invention, it is assumed that eight cell strings are connected to one bit line, which may be shown as a 2D circuit as follows.

Figure 3:
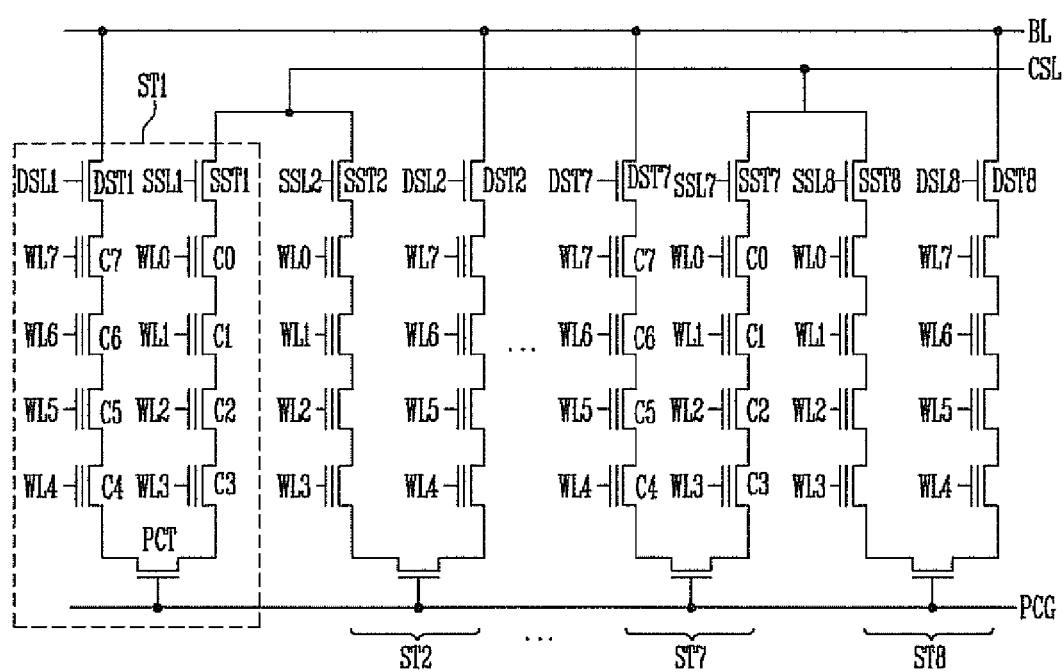
FIG. 3 is a circuit diagram illustrating cell strings connected to a single bit line.

FIG. 3 is a circuit diagram illustrating cell strings connected to a single bit line.

Referring to FIG. 3, eight cell strings ST1 to ST8 are connected to one bit line BL.

The respective cell strings have the same structure. A first cell string ST1 will be representatively described as follows.

In the first cell string ST1, $0^{th}$ to third memory cells C0 to C3, a pipe control transistor (PCT), and fourth to seventh memory cells C4 to C7 are connected in series between a first source selection transistor SST1 and a first drain selection transistor DST1.

A first source selection line SSL1 is connected to a gate of the first source selection transistor SST1. A first drain selection line DSL1 is connected to a gate of the first selection transistor DST1.

The $0^{th}$ to seventh word lines WL0 and WL7 are connected to $0^{th}$ to seventh memory cells C0 to C7, respectively. A pipe control gate (PCG) line is connected to a gate of the pipe control transistor PCT.

Second to eighth cell strings ST2 to ST8 are configured as circuits similar to that of the first cell string. However, second to eighth source selection lines SSL2 to SSL8 are connected to gates of the second to eighth source selection transistors SST2 to SST8, respectively. The eighth source selection transistors SST2 to SST8 are connected to second to eighth cell strings ST2 to ST8, respectively. Second to eighth drain selection lines DSL2 to DSL8 are connected to gates of the second to eighth drain selection transistors DST2 to DST8, respectively.

Drains of the first to eighth selection transistors DST1 to DST8 are commonly connected to the bit line BL. Sources of the first to eighth source selection transistors SST1 to SST8 are commonly connected to the common source line CSL.

In the semiconductor memory device, when programming is performed, other unselected cell strings except for selected cell strings should be prevented from being programmed.

For example, when the first cell string ST1 is selected, the other remaining second to eighth cell strings ST2 to ST8 are boosted so as to be not programmed.

After a channel of an unselected cell string is precharged, a program pass voltage Vpass is applied to unselected word lines. A program voltage Vpgm is applied to selected word lines. Thus, a channel voltage is boosted to inhibit programming.

In the memory cell array 110 having a 3D structure according to an embodiment of the present invention, one cell string should be not programmed seven times during a program operation, because eight strings are connected to one bit line. This means that untargeted memory cells are greatly disturbed due to inhibition of programming. In particular, the memory cells are greatly disturbed by the pass voltage Vpass.

The disturbance increases due to the pass voltage Vpass as a voltage level of the pass voltage Vpass is higher. However, if the pass voltage Vpass is lowered in order to reduce disturbance, enough boosting to inhibit programming may not occur.

An embodiment of the present invention provides a method of using a gate induced drain leakage (GIDL) phenomenon to cause boosting, while using a low pass voltage.

First, the GIDL phenomenon will be described as follows.

The semiconductor memory device having a 3D structure uses the GIDL phenomenon for erasing a memory block.

Figure 4:
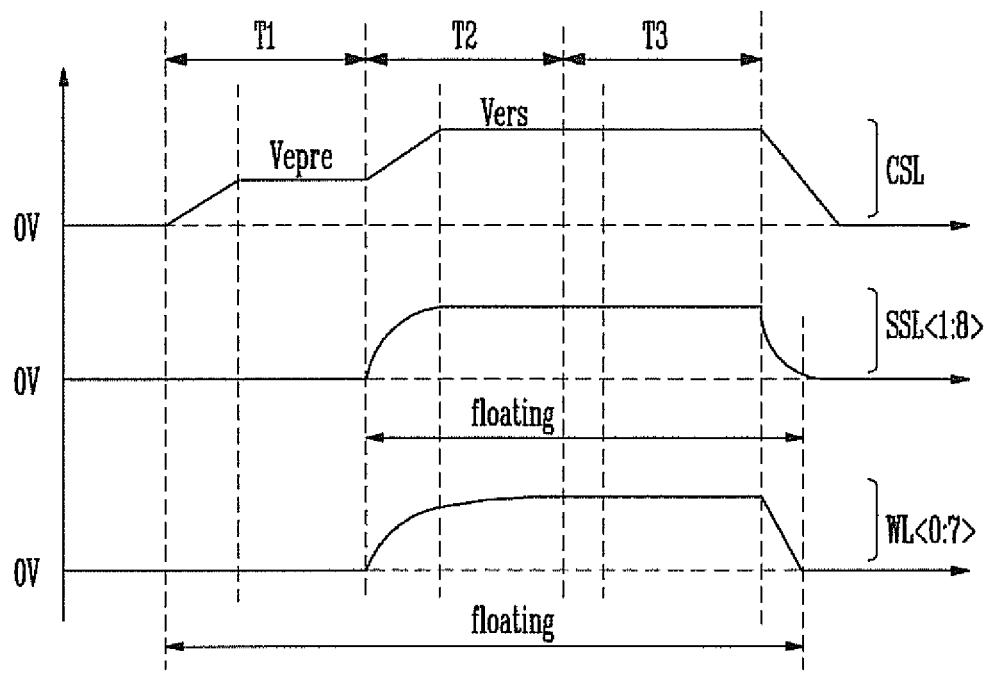
FIG. 4 is a timing diagram illustrating an erase operation of a 3D semiconductor memory device.

FIG. 4 is a timing diagram illustrating an erase operation of a 3D semiconductor memory device.

In the 3D semiconductor memory device, memory cells are generated three-dimensionally based on a U-shaped pillar, i.e., a pipe line, so a substrate or a P-well does not exist. Thus, a method of erasing a memory cell by applying an erase voltage to a substrate or a P well in a 2D semiconductor memory device cannot be used.

An erase method using the GIDL phenomenon as illustrated in FIG. 4 is used.

Referring to FIG. 4, a voltage is first applied to the common source line CSL to apply a precharge voltage Vepre during a first time T1. In this case, the first to eighth source selection lines SSL1 to SSL8 are maintained at about 0V. The first to eighth source selection lines are turned off. All the word lines WL0 to WL8 are in a floated state.

Numerous holes are generated due to the GIDL phenomenon. The channel region of the cell strings is precharged with the holes to raise the channel voltage of the cell strings. A program method according to an embodiment of the present invention uses the feature that the channel voltage is raised due to the GIDL phenomenon. This will be described in detail hereinafter.

During a second time T2, the voltage of the common source line CSL is gradually raised up to an erase voltage Vers. Here, the first to eighth source selection lines SSL1 to SSL8 are floated. The $0^{th}$ to seventh word lines WL0 to WL7 are also maintained in the floated state.

While the voltage of the common source line CSL is gradually raised, a voltage of the first to eighth source selection lines SSL1 to SSL8 is gradually raised. When the voltage of the common source line CSL reaches the erase voltage Vers, the first to eighth source selection transistors SST1 to SST8 are turned on by the voltage of the first to eight source selection lines SSL1 to SSL8.

As the voltage of the $0^{th}$ to seventh word lines WL0 to WL7 is also raised by the erase voltage Vers, the holes generated during the first time T1 are combined with electrons trapped in the memory cells to erase the memory cells.

The memory cells are erased as the electrons trapped in the memory cells are combined with the holes.

In an embodiment of the present invention, a program operation is performed based on the feature which obtains the effect that the channel voltage is raised to a degree while generating the GIDL during the first time T1 in the erase operation.

Figure 5:
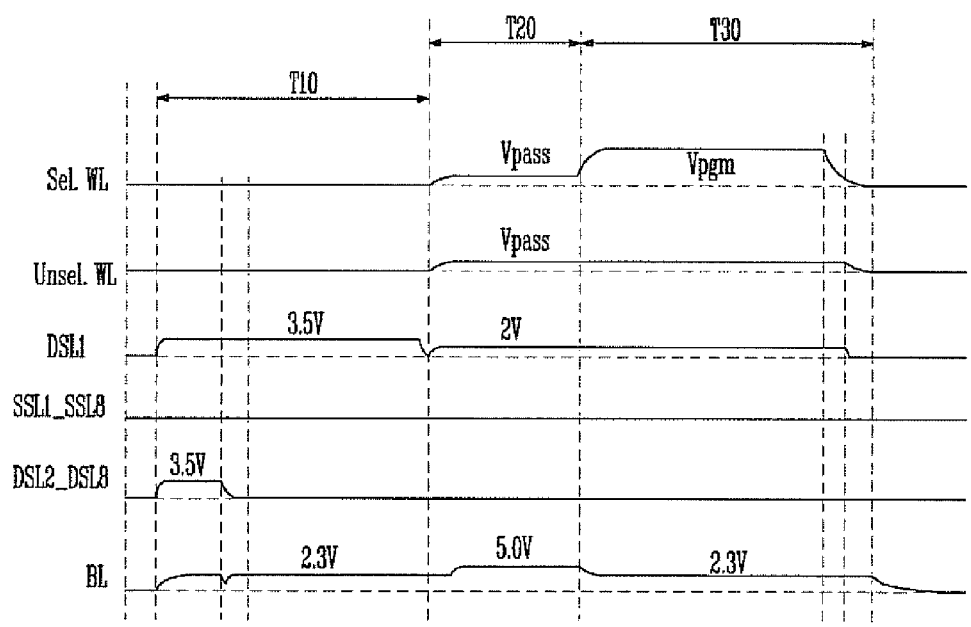
FIG. 5 is an operation timing diagram illustrating a program operation according to an embodiment of the present invention.
Figure 6A:
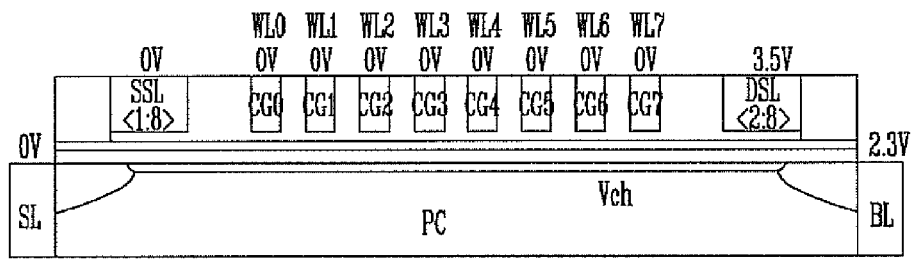
FIGS. 6A to 6C are views illustrating channel states of program-inhibited cell strings while a program operation is being performed.
Figure 6B:
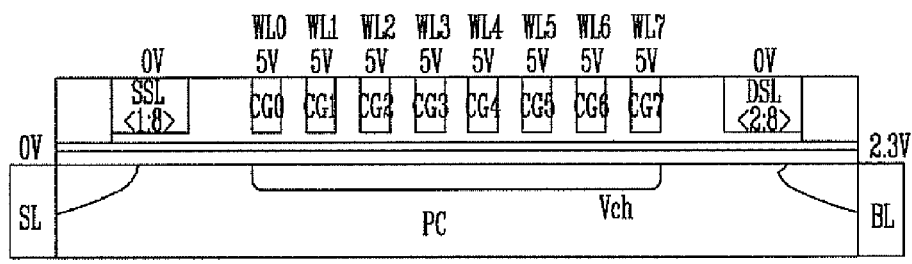
Figure 6C:
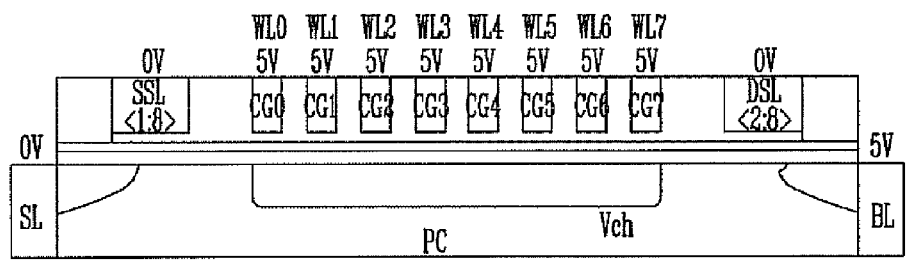

FIG. 5 is an operation timing diagram illustrating a program operation according to an embodiment of the present invention. FIGS. 6A to 6C are views illustrating channel states of program-inhibited cell strings while a program operation is being performed.

In describing a program operation with reference to FIGS. 5 and 6A to 6C, it is assumed that the $0^{th}$ word line WL0 of the first cell string is selected for programming.

First, during a first time T10, about 0V is applied to the $0^{th}$ to seventh word lines WL0 to WL7. About 3.5V is applied to the first to eighth drain selection lines DSL1 to DSL8. About 2.3V is applied to the bit line BL.

After the lapse of a certain time, the voltage of the second to eight drain selection lines DSL2 to DSL8 is changed into about 0V.

Under the assumption that programming is performed by sequentially selecting the $0^{th}$ to seventh word lines WL0 to WL7, when the $0^{th}$ word line WL0 is selected for programming, programming is yet to be performed on the memory cells connected to the $0^{th}$ to seventh word lines WL0 to WL7.

A threshold voltage of the memory cells is about 0V or lower. Thus, when about 0V is applied to the $0^{th}$ to seventh word lines WL0 to WL7, the memory cells are all turned on. The voltage applied to the bit line BL is precharged in the channel of the cell string.

Referring to FIG. 6, when about 0V is applied to the $0^{th}$ to seventh word lines WL0 to WL7, the channel is precharged with the channel voltage Vch.

After the channel is precharged, the pass voltage Vpass is applied to the $0^{th}$ to seventh word lines WL0 to WL7 during a second time T20. In the present embodiment, about 5V is applied as the pass voltage.

In FIG. 6B, as about 5V is applied to the $0^{th}$ to seventh word lines WL0 to WL7, the channel is boosted. The channel voltage Vch is raised.

Here, when about 5V is applied as the voltage of the bit line BL shown in FIG. 6C, the second to eighth drain selection transistors DST2 to DST8 are turned off. Since about 5V has been applied to the bit lines BL, GIDL occurs. Thus, the channel is further boosted.

Although the low pass voltage Vpass is applied, the channel of the cell string is sufficiently boosted. Thus, a program operation may be inhibited at untargeted memory cells coupled to the bit lines BL. Also, since the low pass voltage Vpass is used, a disturbance otherwise due to the pass voltage can be reduced.

The program voltage Vpgm is applied to the selected word lines during a time T30 to perform a program operation. Here, the voltage of the bit line is lowered to 2.3V. The cell channels of the second to eighth strings ST2 to ST8 have been already boosted enough to inhibit programming. When the program voltage Vpgm is further applied, the channels are further boosted. Then, more reliable prevention of programming may be achieved.

Meanwhile, in another embodiment of the present invention, a cell channel may be boosted by causing the GIDL phenomenon between the source selection transistor SST and the common source line CSL, rather than the GIDL phenomenon between the drain selection transistor DST and the bit line.

In order to cause the GIDL phenomenon between the source selection transistor SST and the common source line CSL, a voltage is applied to the common source line CSL when the source selection transistor SST is turned off.

In the semiconductor memory device and the operating method thereof in accordance with the embodiments of the present invention, a low pass voltage is used to boost a channel of an unselected cell string during a program operation. The channel of the cell string is boosted by using the GIDL phenomenon, thereby minimizing a disturbance influence on the memory cells connected to the unselected cell string due to a high pass voltage.

While the present invention has been shown and described in connection with the embodiments, it will be apparent to those skilled in the art that modifications and variations can be made without departing from the spirit and scope of the invention as defined by the appended claims.

What is claimed is:

1. A semiconductor memory device, comprising:
    a memory cell array including cell strings, each including word lines stacked on a substrate and a vertical channel layer formed to penetrate the word lines, wherein two or more of the cell strings are connected to a single bit line through a selection transistor;
    a peripheral circuit for programming a selected memory cell; and
    a control circuit for controlling the peripheral circuit to perform a multi-stepwise boosting process at channels of unselected cell strings to be not programmed during a program operation,
    wherein the multi-stepwise boosting process includes:
        a primary boosting process, including boosting channels of the unselected cell strings by applying a pass voltage to the word lines when drain selection transistors of the unselected cell strings are turned off, and
        a secondary boosting process, including boosting the channels of the unselected cell strings by using a gate induced drain leakage (GIDL) phenomenon occurring between the turned-off drain selection transistors and the bit line when a first voltage is applied to the bit line.

2. The semiconductor memory device of claim 1, wherein the control circuit controls the peripheral circuit to change a voltage of the word line selected for programming into a program voltage after the channels of the unselected cell strings are secondarily boosted.

3. The semiconductor memory device of claim 2, wherein the control circuit controls the peripheral circuit to maintain a drain selection transistor of the selected cell string in a turn-on state in primarily boosting the channels of the unselected cell strings.

4. The semiconductor memory device of claim 1, wherein the first voltage is higher than a voltage of the bit line when the unselected cell strings are precharged, and equal to or higher than the pass voltage.

5. A semiconductor memory device, comprising:
   a memory cell array including cell strings, each including word lines stacked on a substrate and a vertical channel layer formed to penetrate the word lines, wherein each of the cell strings is connected to a common source line through a source selection transistor, and wherein two or more of the cell strings are connected to a single bit line through a drain selection transistor;
   a peripheral circuit for programming a selected memory cell; and
   a control circuit for controlling the peripheral circuit to perform a multi-stepwise boosting process at channels of unselected cell strings to be not programmed during a program operation,
   wherein the multi-stepwise boosting process includes:
   a primary boosting process, including boosting channels of the unselected cell strings by applying a pass voltage to the word lines, when source selection transistors of the unselected cell strings are turned off, and
   a secondary boosting process, including boosting the channels of the unselected cell strings by using a gate induced drain leakage (GIDL) phenomenon occurring between the turned-off source selection transistors and the common source line when a first voltage is applied to the common source line.

6. The semiconductor memory device of claim 5, wherein after the channels of the unselected cell strings are secondarily boosted, the control circuit controls the peripheral circuit to change a voltage of the word lines selected for programming into a program voltage.

7. The semiconductor memory device of claim 6, wherein the control circuit controls the peripheral circuit to maintain a source selection transistor of the selected cell string in a turn-on state in primarily boosting the channels of the unselected cell strings.

8. The semiconductor memory device of claim 5, wherein the first voltage is higher than a voltage of the bit line when the unselected cell strings are precharged, and equal to or higher than the pass voltage.

9. A method of operating a semiconductor memory device, the method comprising:
   precharging channels of cell strings connected to drain selection transistors connected to one bit line, respectively;
   performing a primary boosting of channels of unselected cell strings by applying a pass voltage to word lines coupled to the cell strings when the drain selection transistors connected to the unselected cell strings are turned off;
   performing a secondary boosting of the channels of the unselected cell strings by using a gate induced drain leakage (GIDL) phenomenon occurring between the drain selection transistors of the unselected cell strings and the bit line by applying a first voltage to the bit line, when the drain selection transistors connected to the unselected cell strings are turned off; and
   performing programming by applying a program voltage to word lines selected for programming.

10. The method of claim 9, wherein, in the primarily boosting, a drain selection transistor of the selected cell string is maintained in a turn-on state.

11. The method of claim 9, wherein the first voltage is higher than the bit line voltage in the precharging of the cell strings, and is equal to or higher than the pass voltage.

12. A method of operating a semiconductor memory device, the method comprising:
   precharging channels of cell strings connected to drain selection transistors connected to one bit line, respectively, by using a voltage inputted through the bit line;
   performing a primary boosting of channels of unselected cell strings by applying a pass voltage to word lines coupled to the cell strings when source selection transistors connected between the unselected cell strings and a common source line are turned off;
   performing a secondary boosting of the channels of the unselected cell strings by using a gate induced drain leakage (GIDL) phenomenon occurring between the source selection transistors of the unselected cell strings and the common source line by applying a first voltage to the common source line, when the source selection transistors of the unselected cell strings are turned off; and
   performing programming by applying a program voltage to word lines selected for programming.

13. The method of claim 12, wherein, in the primarily boosting, a source selection transistor of the selected cell string is maintained in a turn-on state.

14. The method of claim 12, wherein the first voltage is higher than the bit line voltage in the precharging of the cell strings, and is equal to or higher than the pass voltage.

* * * * *